United States Patent
Lee et al.

(10) Patent No.: US 7,150,632 B2
(45) Date of Patent: Dec. 19, 2006

(54) LAND GRID ARRAY SOCKET HAVING IMPROVED TERMINALS

(75) Inventors: Genn-Sheng Lee, Tu-Chen (TW); Li-Chen Chen, Tu-Chen (TW); Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 91 days.

(21) Appl. No.: 11/099,185

(22) Filed: Apr. 4, 2005

(65) Prior Publication Data

US 2005/0239303 A1 Oct. 27, 2005

(30) Foreign Application Priority Data

Apr. 16, 2004 (TW) .............................. 93110605 A

(51) Int. Cl.
*H01R 12/00* (2006.01)
(52) U.S. Cl. ...................................................... 439/66
(58) Field of Classification Search .................. 439/66, 439/67, 515, 514
See application file for complete search history.

(56) References Cited

U.S. PATENT DOCUMENTS 4,699,593 A * 10/1987 Grabbe et al. ................ 439/71
5,984,693 A * 11/1999 McHugh et al. ............... 439/66
6,957,964 B1 * 10/2005 Chiang ......................... 439/66
2004/0266225 A1 * 12/2004 Chiang ......................... 439/66

* cited by examiner

Primary Examiner—Phuong Dinh
(74) Attorney, Agent, or Firm—Wei Te Chung

(57) ABSTRACT

A land grid array socket (1) comprises an insulative housing (11) having a plurality of passageways (113) extending throughout a top surface (111) and an opposite bottom surface (113) and a plurality of electrical terminals (5) received in corresponding passageways, respectively. Each terminal including a base portion (51) in the passageway and a first spring arm (55) extending out of the top surface of the housing and adapted to be electrically connected with a first electronic component (2) and a second spring arm (54) extending out of the bottom surface of the housing and adapted to be electrically connected with a second electronic component (3). Wherein the first and the second spring arms each has a resisting portion (531, 521), the resisting portions resist the base portion when the spring arms are pressed by the first and the second electronic components so as to form a shorter electrical circuit path between the electronic components.

2 Claims, 5 Drawing Sheets

LAND GRID ARRAY SOCKET HAVING IMPROVED TERMINALS

BACKGROUND OF THE INVENTION

1. Field of the Invention

The present invention relates to the art of electrical connectors, and more particularly to a land grid array (LGA) socket having electrical terminals for electrically connecting two separate electronic components.

2. The Prior Art

A conventional terminal 7 of a land grid array (LGA) socket is illustrated in FIG. 6. The terminal 7 includes a base portion for securing the terminal 62 in an insulative housing of the LGA socket and a pair of spring arms 72 and 73 respectively extending out of opposite surfaces of the housing for resisting two separate electronic components so as to establish electrical connection between the two components. However, capacitance of the terminal 7 is relatively low which cannot satisfy the requirement of high frequency transmission. Further, an electrical circuit path of the terminal 7 is from a top contacting point 721 of the spring arm 72 to a bottom contacting point 731 of the spring arm 73, which is too long and results in a relatively high impedance of the whole terminal 7, and high impedance also can not satisfy the requirement of high frequency transmission.

As an improvement to the terminal 7 in FIG. 6, another patent application, with a patent application Ser. No. 11/027,723 having one common applicant and assigned to the same assignee with the present invention, has disclosed another kind of terminal 8. As illustrated in FIG. 7, the terminal 8 comprises a first part 81 and a second part 83 separate from the first part 81. The first and the second parts 81 and 83 are received in a same passageway of an insulative housing of a LGA socket and interconnected in the passageway by a bridge portion 812 formed therebetween. Further, a base plate 811 of the first part 81, cooperating with a base portion 832 of the second part 83, forms a substantially encircled inner space, which greatly increases the capacitance of the terminal 8 so as to improve the high frequency characteristic of the terminal 8. However, the electrical circuit path of the terminal 8 is still too long, which even longer than the terminal 7 as disclosed in FIG. 6. The long circuit path still leads to a relatively high impedance of the whole terminal 8, which is not desirable in high frequency transmission. Therefore, there is a need to develop a new terminal to overcome the above shortcomings.

SUMMARY OF THE INVENTION

Accordingly, a main object of the present invention is to provide an land grid array (LGA) socket having an improved terminals, wherein the terminals have a relatively short circuit path and a relatively low impedance so as to ensure desired high frequency signal transmission.

To fulfill the above-mentioned object, an land grid array (LGA) socket in accordance with the present invention comprises an insulative housing having a plurality of passageways extending throughout a top surface and an opposite bottom surface and a plurality of electrical terminals received in corresponding passageways of the housing, respectively. Each terminal includes a base portion in the passageway and a first spring arm extending out of the top surface of the housing and adapted to be electrically connected with a first electronic component and a second spring arm extending out of the bottom surface of the housing and adapted to be electrically connected with a second electronic component; and wherein the first and the second spring arms each has a resisting portion, the resisting portions resist the base portion when the spring arms are pressed by the first and the second electronic components so as to form a shorter electrical circuit path between the electronic components.

Further, the first spring arm of the terminal extends out of the top surface of the housing from a first securing portion of the terminal, and the second spring arm of the terminal extends out of the bottom surface of the housing from a second securing portion of the terminal. The base portion of the terminal comprises a first base plate interconnecting the first and the second securing portions of the terminal and a second base plate connects to one of the first and second securing portions and opposite to the first base plate, and the first and the second base plates and the first and the second securing portions encircle a substantially closed inner space. The high frequency characteristics of the terminal might be justified to its desired level by modify dimension of the inner space.

DETAILED DESCRIPTION OF PREFERRED EMBODIMENT

Reference will now be made to the drawings to describe the present invention in detail.

Figure 1:
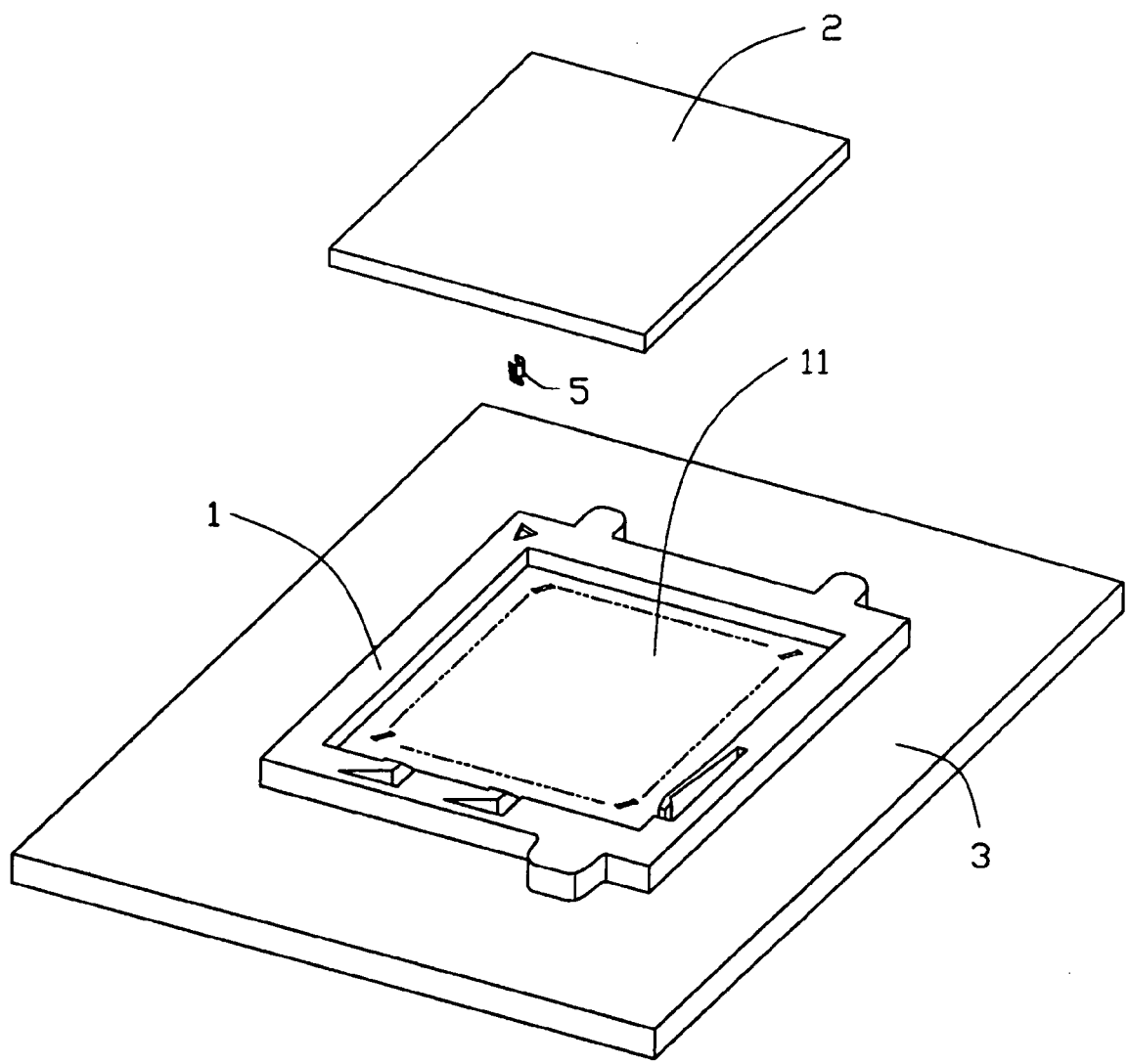
FIG. 1 is a perspective view of f a land grid array (LGA) socket in accordance with a preferred embodiment of the present invention, the socket is sandwiched between a first electronic component and a second electronic component.
Figure 3:
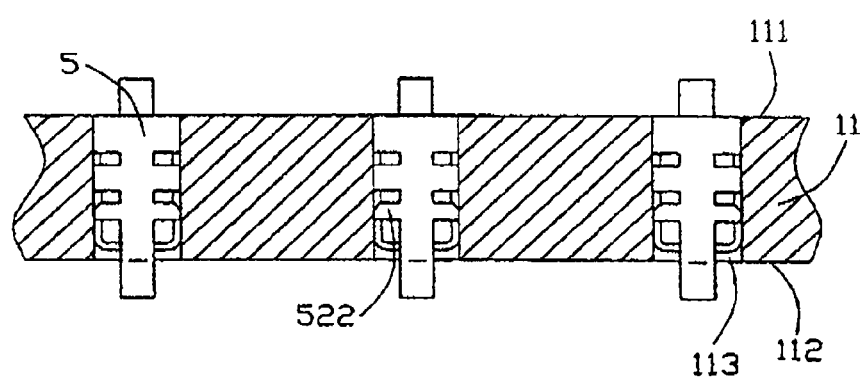
FIG. 3 is a cross-sectional view showing the terminal of FIG. 2 to be received in a passageway of an insulative housing of the socket of FIG. 1.

Referring to FIGS. 1 and 3, a land grid array socket 1 in accordance with a preferred embodiment of the present invention is illustrated. The socket 1 includes a planar and rectangular housing 11, the housing 11 is made of insulative material such as plastic, and a plurality of passageways 113 extend throughout a top surface 111 and a bottom surface 112 of the housing 11. The socket 1 is sandwiched between a first electronic component 2 and a second electronic component 3 and electrically and mechanically interconnects the first and the second components 2 and 3 via a number of electrical terminals 5 received in the passageways 113.

In this embodiment, the first electronic component 2 might be an IC chip having a plurality of electrical pads formed at a bottom surface thereof and the second electronic component 3 might be a motherboard having a plurality of electrical pads formed at a top surface thereof, number of the pads of the first and the second components 2 and 3 are identical to that of the electrical terminals 5 and electrically connected to the terminals 5.

Figure 2:
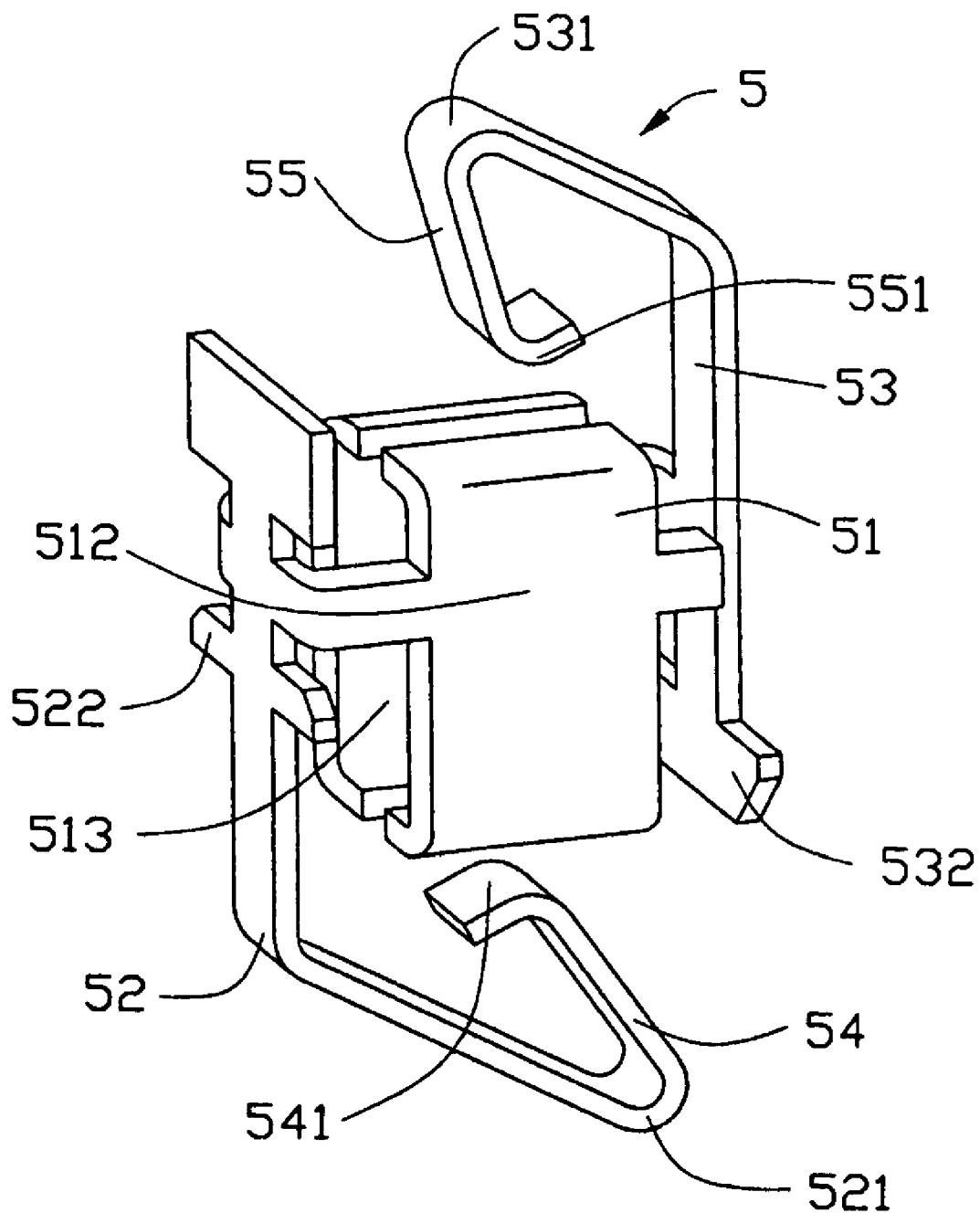
FIG. 2 is a perspective view of an electrical terminal in the LGA socket of FIG. 1.

Referring to FIG. 2, each terminal 5 has a first spring arm 53 and a second spring arm 52, the first and the second spring arms 53 and 52 have substantially same structures and are interconnected by a base portion 51 formed therebetween. The first spring arm 53 comprises a first securing portion 532 and a first resisting portion 55 extending upwardly from the securing portion 532, the first resisting portion forms an outer resisting point 531 at a highest top thereof and an inner resisting point 551 at a free end thereof. When an outer pressing force does not press the spring arm 53, the inner resisting point 551 is located above the base portion 51 and does not contact with the base portion 51. The second spring arm 52 comprises a second securing portion 522 and a second resisting portion 54 extending downwardly from the securing portion 522, the second resisting portion forms an outer resisting point 521 at a lowest top thereof and an inner resisting point 541 at a free end thereof. When an outer pressing force does not press the spring arm 52, the inner resisting point 541 is located beneath the base portion 51 and does not contact with the base portion 51. The base portion 51 comprises a first base plate 513 interconnects the first and the second securing portion 532 and 522 of the first and the second spring arms 53 and 52 and a second base plate 512 extending from one side of the second securing portion 522 opposite to the first base plate 513. The first and the second base plate 513 and 512 are spaced from each other, which corporate with the first and the second securing portion 532 and 522 so as to encircle a substantially closed inner space. It is to be understood that dimension of the inner space is modifiable by changing configuration of the first and the second base plate 513 and 512 or by changing distance between the first and the second base plate 513. Modification of the dimension of the inner space can lead to alteration of the high frequency characteristic of the terminal 5.

Figure 4:
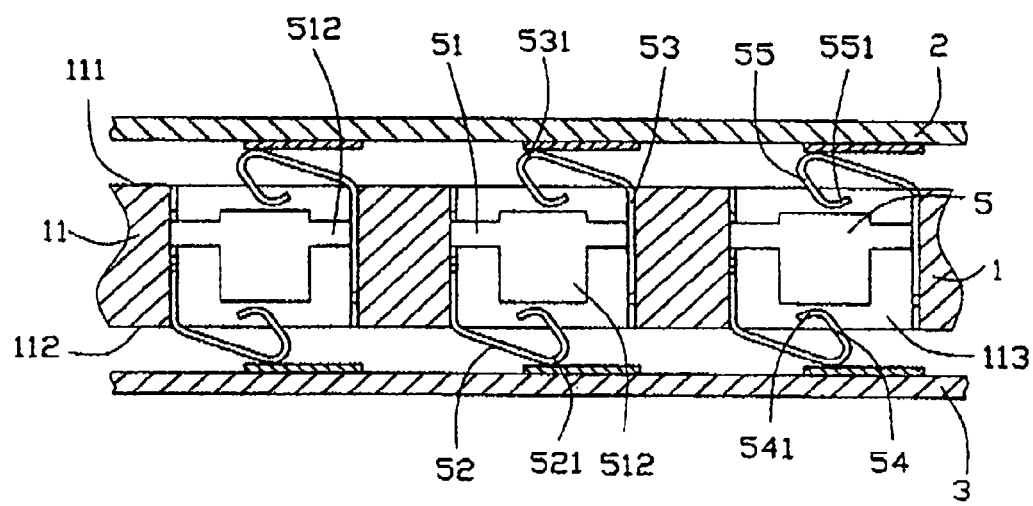
FIG. 4 is a cross-sectional view showing the terminal of FIG. 2 to be received in the passageway of the housing of the socket of FIG. 1, and the first and the second electronic components contact with the terminal but do not apply any pressing force to the terminal.
Figure 5:
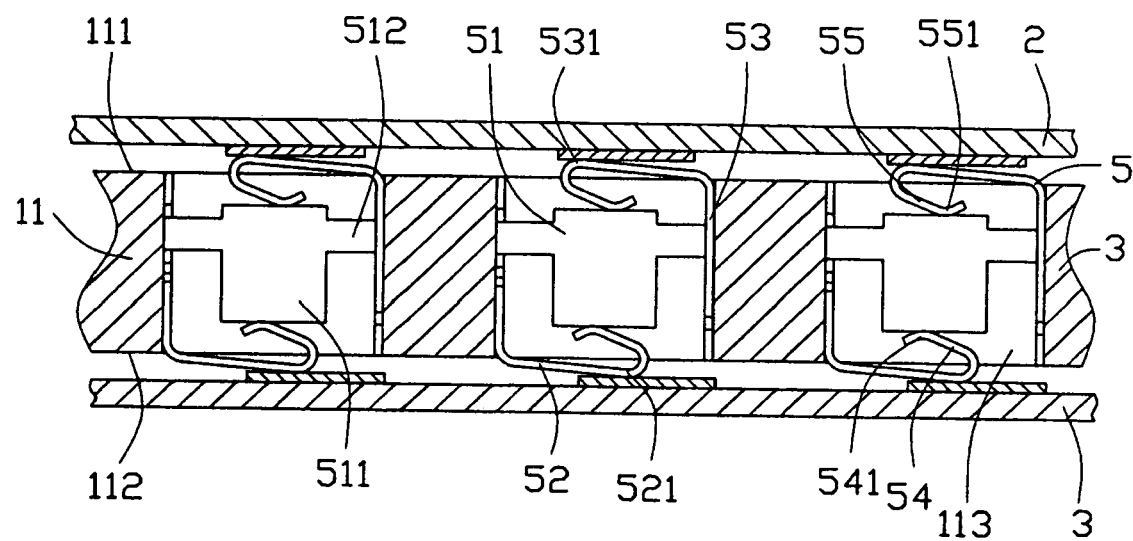
FIG. 5 is similar to FIG. 4, and the first and the second electronic components apply a pressing force toward the terminal.
Figure 6:
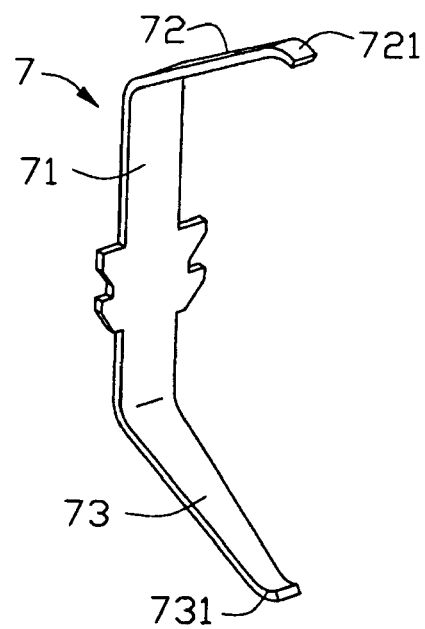
FIG. 6 is a perspective view of a conventional LGA terminal.
Figure 7:
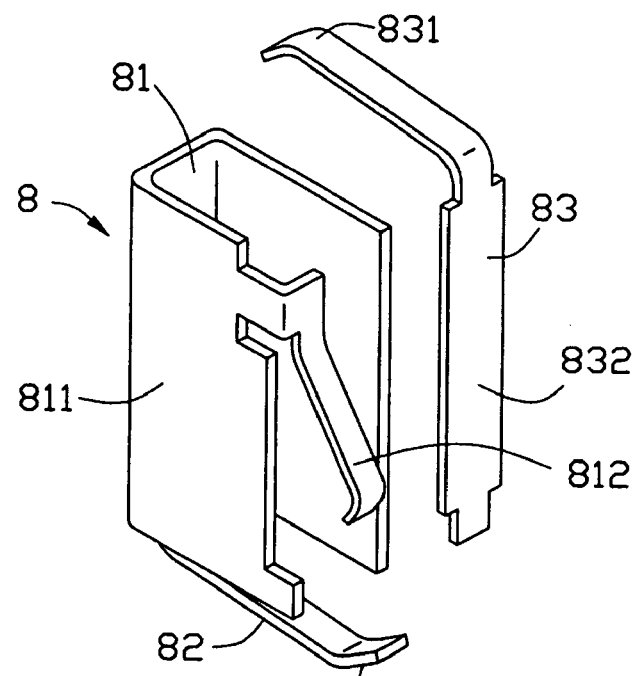
FIG. 7 is a perspective view of another conventional LGA socket.

Referring to FIGS. 4 and 5, the socket 1 is sandwiched between the first electronic component 2 and the second electronic component 3. FIG. 4 illustrates an initial state where the electrical pads on the first and the second components 2 and 3 slightly contact with the outer resisting points 531 and 541, respectively; The components 2 and 3 do not apply any pressing force to the terminals 5 such that the inner resisting points 551 and 521 do not contact with the base portion 51. FIG. 5 illustrates a final state where the components 2 and 3 respectively apply a pressing force to the terminal 5 such that the first and the second spring arms 53 and 52 are pressed and bent down toward the base portion 51, and the inner resisting points 551 and 541 all resist the base portion 51. Therefore, a relatively shorter electrical circuit path is established in the terminal 5 when the terminal 5 is used to transmitted signal between the first and the second components 2 and 3. The shorter electrical circuit path includes two portions, one is the portion between the outer resisting points 531 and 521 and the inner resisting points 551 and 541, and the other is the base portion 51. That is, the circuit path only occupies small part of the long spring arms 53 and 52 and avoids circling the whole length of the spring arms 53 and 52 so as to largely shorten the overall length of the circuit path.

It is noted that the terminal 5 of the present invention can be modified to more than one piece in an alternative embodiment, the more than one piece of the terminal 5 can be received and interconnected in a same passageway, if only the resisting points of the terminal 5 can resist a certain portion of the terminal 5 after the resisting points are pressed by an outer pressing force and form a shorter electrical circuit path. From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed is:

1. An electrical connector comprising:
   an insulative housing having a plurality of passageways extending throughout a top surface and an opposite bottom surface;
   a plurality of electrical terminals received in corresponding passageways, respectively; each terminal including a base portion in the passageway and a first spring arm extending out of the top surface of the housing and adapted to be electrically connected with a first electronic component and a second spring arm extending out of the bottom surface of the housing and adapted to be electrically connected with a second electronic component; and
   wherein the first and the second spring arms each has a resisting portion, the resisting portions do not resist the base portion before the spring arms are pressed by the first and the second electronic components, and resist the base portion after the spring arms are pressed by the first and the second electronic components so as to form a shorter electrical circuit path between the electronic components; wherein
   the first spring arm of the terminal extends out of the top surface of the housing from a first securing portion of the terminal, and the second spring arm of the terminal extends out of the bottom surface of the housing from a second securing portion of the terminal; wherein
   the base portion of the terminal comprises a first base plate interconnecting the first and the second securing portions of the terminal and a second base plate connects to one of the first and second securing portions and opposite to the first base plate; wherein
   the first and the second base plates and the first and the second securing portions encircle a substantially closed inner space; wherein
   at least one barb is formed at each of the first and the second securing portions for securing the terminal in the passageway; wherein
   the resisting portions are formed in free ends of the first and the second spring arms and each comprises an outer resisting point and an inner resisting point.

2. The electrical connector of claim 1, wherein the outer resisting points resist the first and the second components when the spring arms are pressed down by the first and the second components, and the inner resisting points do not contact with the base portion before the first and the second spring arms are pressed by the first and the second electronic components.

* * * * *